United States Patent [19]
Uchikawa et al.

[11] Patent Number: 5,498,498
[45] Date of Patent: Mar. 12, 1996

[54] PHOTOSENSITIVE RESIN COMPOSITION USED IN A METHOD FOR FORMING A LIGHT-SHIELDING FILM

[75] Inventors: Kiyoshi Uchikawa; Hiroshi Komano; Toshimi Aoyama; Katsuyuki Ohta, all of Kanagawa, Japan

[73] Assignee: Tokyo Ohka Kogyo Co., Ltd., Kanagawa, Japan

[21] Appl. No.: 282,464

[22] Filed: Aug. 1, 1994

Related U.S. Application Data

[62] Division of Ser. No. 94,214, Jul. 21, 1993, Pat. No. 5,368,991.

[30] Foreign Application Priority Data

Jul. 29, 1992 [JP] Japan .................... 4-221991

[51] Int. Cl.$^6$ .............. G03F 7/38; G03F 7/022; G03F 7/008
[52] U.S. Cl. .................. 430/7; 430/25; 430/28; 430/192; 430/197; 430/270.14; 430/281.1; 430/288.1; 430/321; 430/325; 430/330
[58] Field of Search .................. 430/7, 321, 325, 430/330, 288, 25, 28, 192, 197, 270, 281

[56] References Cited

U.S. PATENT DOCUMENTS

| | | | |
|---|---|---|---|
| 3,969,751 | 7/1976 | Drukaroff et al. | 357/30 |
| 4,369,241 | 1/1983 | Odaka et al. | 430/28 |
| 4,590,138 | 5/1986 | Lambert et al. | 430/25 |
| 4,812,387 | 3/1989 | Suzuki et al. | 430/20 |
| 5,081,004 | 1/1992 | Vinouze et al. | 430/20 |
| 5,095,379 | 3/1992 | Fukunaga et al. | 430/91 |
| 5,151,336 | 9/1992 | Yokosuka | 430/7 |
| 5,248,576 | 9/1993 | Yokoyama et al. | 430/7 |

*Primary Examiner*—John S. Y. Chu
*Attorney, Agent, or Firm*—Sughrue, Mion, Zinn, Macpeak & Seas

[57] ABSTRACT

Disclosed is a photosensitive resin composition for use in a light-shielding film, comprising a photosensitive resin and a light-shielding coloring material, wherein light transmission properties after formation of the light-shielding film are controlled by the light-shielding coloring material so that (i) the light transmission through the light-shielding film is 1% or more in at least one wavelength of a light wavelength region of from 330 nm to less than 425 nm, and (ii) the light transmission through the light-shielding film is 2% or less in a light wavelength region of from 425 to 650 nm.

10 Claims, 6 Drawing Sheets

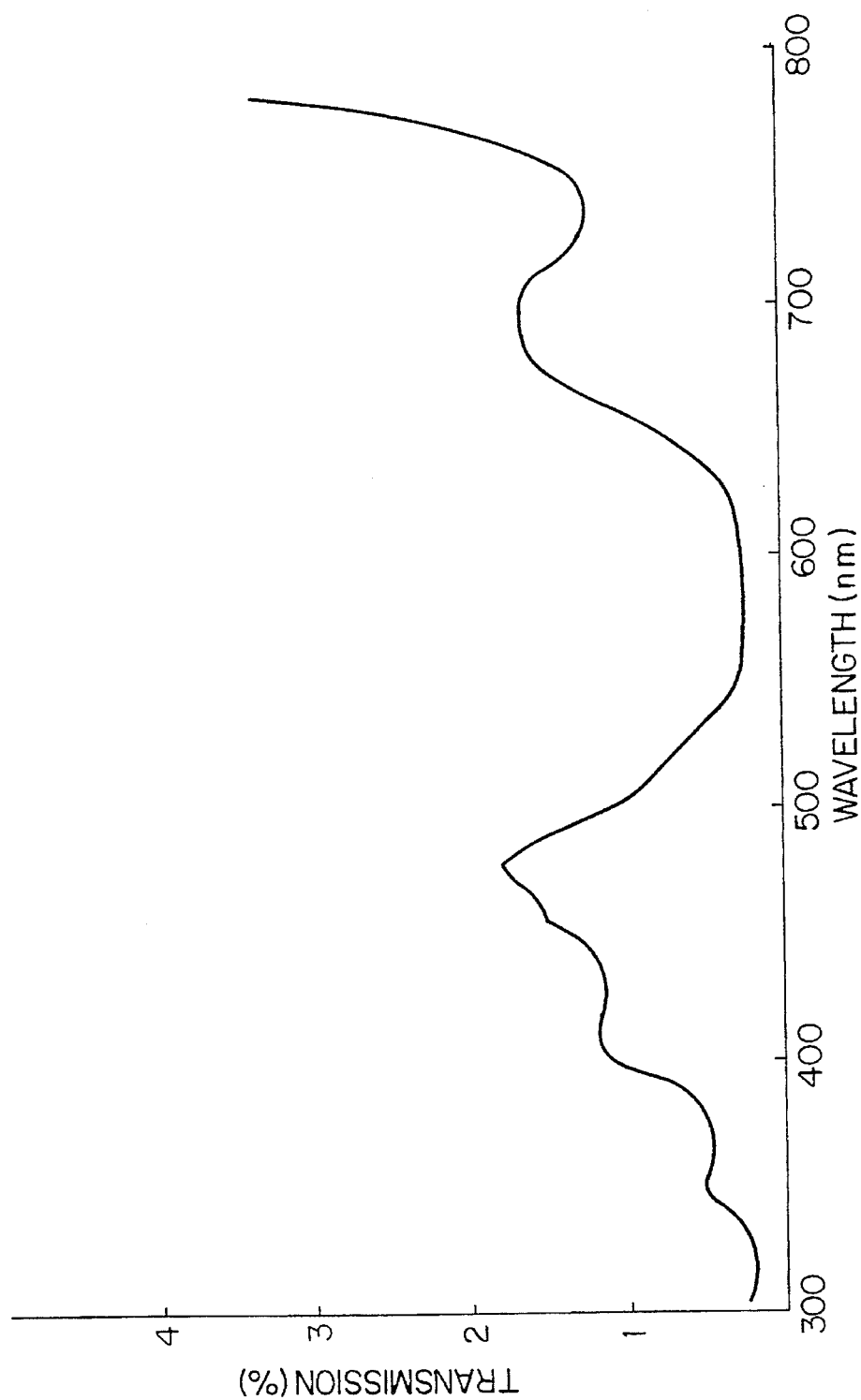

PHOTOSENSITIVE RESIN COMPOSITION USED IN A METHOD FOR FORMING A LIGHT-SHIELDING FILM

This is a divisional of application Ser. No. 08/094,214 filed Jul. 21, 1993, U.S. Pat. No. 5,368,991.

FIELD OF THE INVENTION

The present invention relates to a photosensitive resin composition for light-shielding film which can be used as black matrices or black stripes for black-and-white or color liquid crystal displays, view finders for video cameras, plasma displays, fluorescence displays, and the like, and for prevention of operating errors due to light in TFT (thin-film transistor) and semiconductor elements formed or mounted on glass.

BACKGROUND OF THE INVENTION

Partitions for matrices of color plasma display panels, and the like, have conventionally been formed by screen printing suited for mass production. However, since screen printing encounters difficulty in forming partitions of 80 μm or less in width, a photolithographic technique using a photosensitive resin has been developed for formation of highly precise, dense, and uniform partitions. The technique of using a photosensitive resin is also suitable for production of wide displays such as high definition TV.

The partitions in the above-mentioned fields must have sufficient light shielding properties in the visible region, and to achieve this effect, metallic chromium or carbon powder has been used as a light shielding material. However, partitions (light-shielding films) containing chromium are liable to cause halation due to the high reflectance, and pigment-dispersed resists mainly comprising carbon are not readily usable due to the low sensitivity.

Where a black matrix is provided on a TFT element or where a light-shielding film is used for the purpose of preventing operating errors due to light in semiconductor elements mounted on glass, use of conductive metals, such as chromium, necessitates provision of an insulating layer. Similarly, carbon, if used in a large quantity for manifestation of sufficient light shielding properties, gives rise to the problem of electric conduction. If a photosensitive resin composition containing an organic pigment or dye is arbitrarily used in order to reduce the requisite amount of carbon, the light transmission in the ultraviolet region of less than 425 nm, which concerns photosensitivity, is considerably reduced. In addition, the increased pigment concentration relative to a photosensitive resin leads to remarkable deterioration in sensitivity and developability.

SUMMARY OF THE INVENTION

An object of the present invention is to provide a photosensitive resin composition which is excellent in photosensitivity and developability and provides, upon curing, a light-shielding film with satisfactory light shielding properties.

This and other objects of the present invention are accomplished by a photosensitive resin composition for use in a light-shielding film, comprising a photosensitive resin and a light-shielding coloring material, wherein light transmission properties after formation of the light-shielding film are controlled by a light-shielding coloring material so that (i) the light transmission through the light-shielding film is 1% or more in at least one wavelength of a light wavelength region of from 330 nm to less than 425 nm, and (ii) the light transmission through the light-shielding film is 2% or less in a light wavelength region of from 425 to 650 nm. The latter-mentioned wavelength region is a relative high visible light sensitivity region.

BRIEF DESCRIPTION OF THE DRAWINGS

FIGS. 2 and 3 each are a transmission curve of the light-shielding film prepared in Examples 1 and 2, respectively.

DETAILED DESCRIPTION OF THE INVENTION

Figure 6:
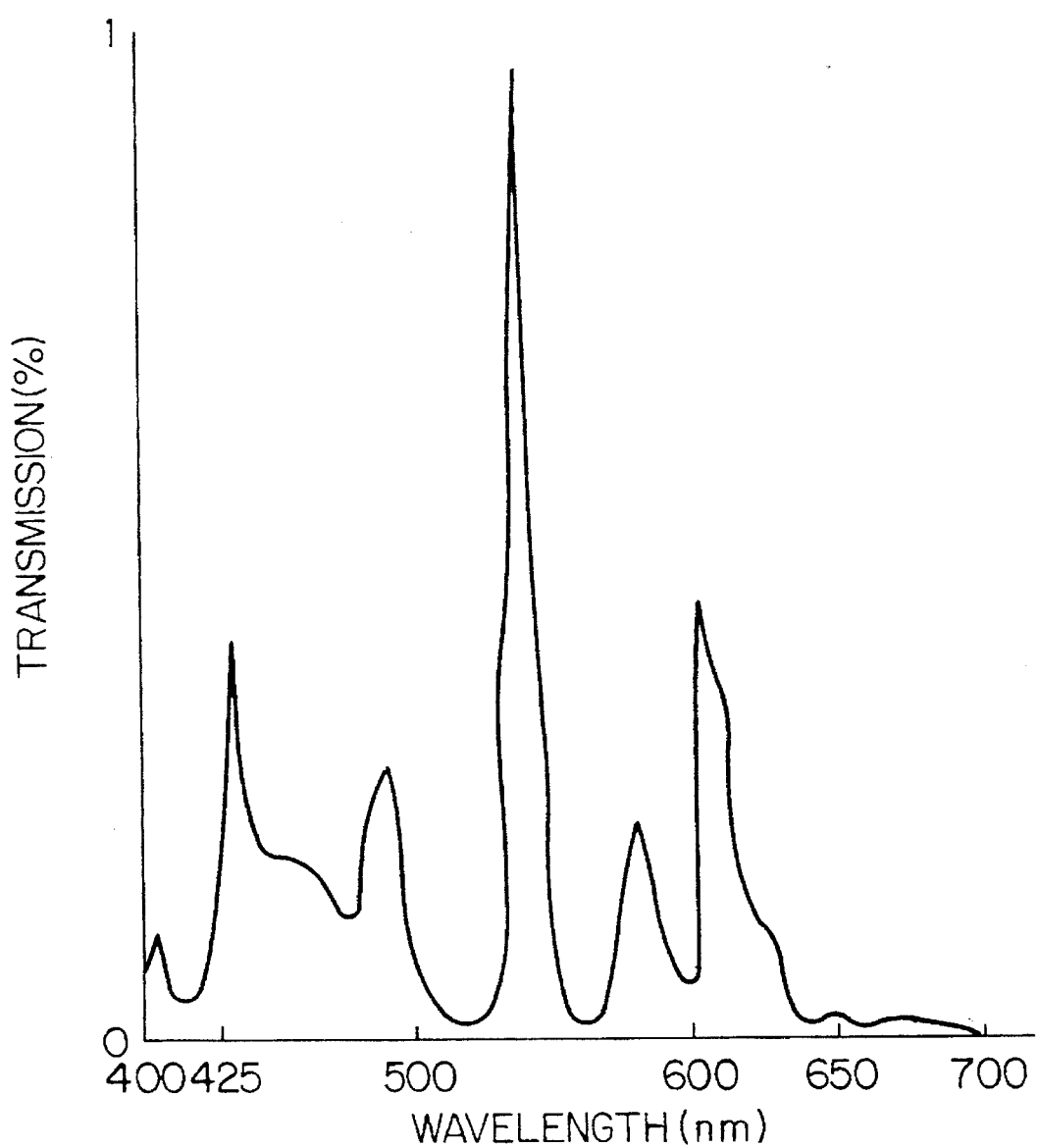
FIG. 6 is a transmission curve showing the wavelength of RGB (Red, Green, Blue).

In the field of black stripes or black matrices, color formation is performed with RGB (Red, Green, Blue) by means of a three-wavelength tube. The wavelength of RGB is within a range of from 425 to 650 nm as shown in FIG. 6. Accordingly, the light-shielding film must block the light of this wavelength range. However, according to the present inventors' study, light within this range does not necessarily need to be completely shielded, and it was proved that a light-shielding film is sufficiently useful unless its transmission exceeds 2% within the above wavelength region of from 425 to 650 nm.

While efficient curing of a photosensitive resin is achieved with light of short wavelength having relatively high energy, an attempt to completely shield the visible light (from 425 to 650 nm) results in shielding of all light of less than 425 nm. As a result, the sensitivity is reduced to cause insufficient curing. The inventors have found that, if the upper limit of the transmission in the visible region may be lifted up to 2% at the highest, the transmission in part of the UV region (from 330 nm to less than 425 nm) can be increased to 1% or more by proper choice of a light-shielding coloring material. It has also been ascertained that curing of a photosensitive resin by exposure to light can be effected sufficiently only if the transmission in part of the UV region is 1% or more. That is, the present inventors have discovered a balance of light transmissions in the visible and UV regions and thus discovered the present invention.

The light transmission through the light-shielding film is preferably 1.5% or more in at least one wavelength of a light wavelength region of from 330 nm to less than 425 nm, and the light transmission is preferably 0.5% or less in a light wavelength region of from 425 to 650 nm.

Figure 1A:
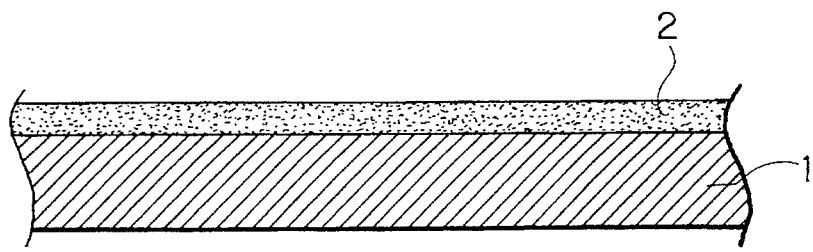
FIG. 1 illustrates a flow chart for forming a light-shielding film using a photosensitive resin composition of the present invention, wherein Nos. 1, 2, 3, and 4 represent a substratum , a photosensitive resin layer, a pattern mask, and a light-shielding film, respectively.
Figure 1B:
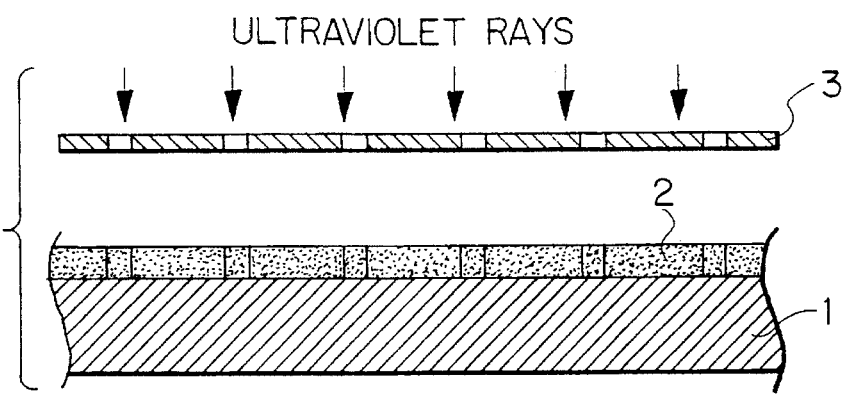
Figure 1C:
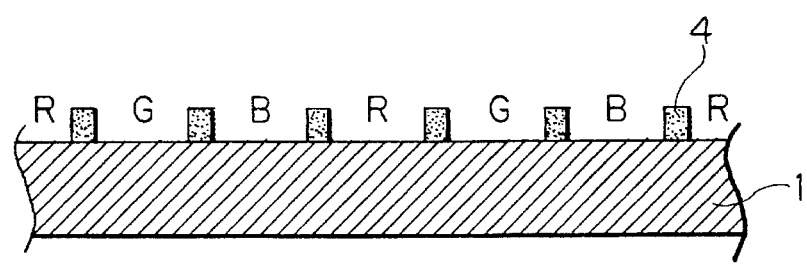

In FIG. 1 is shown a flow chart for forming a light-shielding film for black stripes by using the photosensitive resin composition of the present invention. In FIG. 1-(a), a photosensitive resin composition is coated on Substratum 1 made of glass, and the like, by roller coating, curtain flow coating, screen printing, spray coating, spinner coating, and the like, to a thickness of from 0.5 to 50 μm and dried to form Photosensitive Resin Layer 2. Photosensitive Resin Layer 2 is then exposed to UV light through Pattern Mask 3 as shown in FIG. 1-(b). The photosensitive resin on the undesired part is removed by development, and the remaining resin is heat treated at about 200° C. for complete curing as shown in FIG. 1-(c). Light-shielding Film 4 thus formed constitutes a matrix each of R, G, and B (Red, Green, and Blue).

The photosensitive resin composition of the present invention can be prepared by dissolving or suspending a light-shielding coloring material in a conventionally known photosensitive resin or photosensitive resins described herein.

The light-shielding coloring material which can be used in the present invention preferably comprises a combination of at least two different coloring materials such as (i) a combination of at least one black coloring material such as carbon black, a black pigment, and a black dye, and at least one pigment or dye which can yield blue, red, yellow, and the like, other than black; and (ii) a combination of at least two different coloring pigments or dyes.

The above pigments are inclusive of organic as well as inorganic pigments. Suitable organic pigments include phthalocyanine pigments, anthraquinone pigments, perylene pigments, isoindoline pigments, quinacridone pigments, azo lake pigments, azo pigments, dis-azo pigments, dioxazine pigments, thioindigo pigments, and mixtures thereof. Inorganic pigments, such as carbon and titanium carbon, may also be employed.

The pigments which can be used as the light-shielding coloring materials of the present invention preferably have a mean particle size of from 0.05 to 2.0 μm, and more preferably from 0.1 to 1.2 μm. When a mean particle size is more than 2.0 μm, it is difficult to make the film thickness thin as desired. When a mean particle size is less than 0.05 μm, light shielding properties and heat resistance tend to be reduced.

Specific examples of yellow pigments which can be used as the light-shielding coloring materials of the present invention include C.I. Pigment Yellow 1, C.I. Pigment Yellow 2, C.I. Pigment Yellow 3, C.I. Pigment Yellow 4, C.I. Pigment Yellow 5, C.I. Pigment Yellow 6, C.I. Pigment Yellow 7, C.I. Pigment Yellow 10, C.I. Pigment Yellow 11, C.I. Pigment Yellow 12, C.I. Pigment Yellow 13, C.I. Pigment Yellow 14, C.I. Pigment Yellow 15, C.I. Pigment Yellow 16, C.I. Pigment Yellow 17, C.I. Pigment Yellow 23, C.I. Pigment Yellow 65, C.I. Pigment Yellow 73, C.I. Pigment Yellow 83, and C.I. Pigment Yellow 139.

Among these, preferred are C.I. Pigment Yellow 1, C.I. Pigment Yellow 3, C.I. Pigment Yellow 12, C.I. Pigment Yellow 13, C.I. Pigment Yellow 14, C.I. Pigment Yellow 83, and C.I. Pigment Yellow 139.

Specific examples of orange pigments which can be used as the light-shielding coloring materials of the present invention include C.I. Pigment Orange 1, C.I. Pigment Orange 2, C.I. Pigment Orange 5, C.I. Pigment Orange 13, C.I. Pigment Orange 14, C.I. Pigment Orange 15, C.I. Pigment Orange 16, C.I. Pigment Orange 17, C.I. Pigment Orange 24, and C.I. Pigment Orange 31.

Among these, preferred is C.I. Pigment Orange 13.

Specific examples of red pigments which can be used as the light-shielding coloring materials of the present invention include C. I. Pigment Red 1, C.I. Pigment Red 2, C.I. Pigment Red 3, C.I. Pigment Red 4, C.I. Pigment Red 5, C.I. Pigment Red 6, C.I. Pigment Red 7, C.I. Pigment Red 8, C.I. Pigment Red 9, C.I. Pigment Red 10, C.I. Pigment Red 11, C.I. Pigment Red 12, C.I. Pigment Red 13, C.I. Pigment Red 14, C.I. Pigment Red 15, C.I. Pigment Red 16, C.I. Pigment Red 17, C.I. Pigment Red 18, C.I. Pigment Red 19, C.I. Pigment Red 21, C.I. Pigment Red 22, C.I. Pigment Red 23, C.I. Pigment Red 30, C.I. Pigment Red 31, C.I. Pigment Red 32, C.I. Pigment Red 37, C.I. Pigment Red 38, C.I. Pigment Red 39, C.I. Pigment Red 40, C.I. Pigment Red 41, C.I. Pigment Red 48, C.I. Pigment Red 49, C.I. Pigment Red 50, C.I. Pigment Red 51, C.I. Pigment Red 52, C.I. Pigment Red 53, C.I. Pigment Red 54, C.I. Pigment Red 55, C.I. Pigment Red 57, C.I. Pigment Red 58, C.I. Pigment Red 60, C.I. Pigment Red 63, C.I. Pigment Red 64, C.I. Pigment Red 68, C.I. Pigment Red 81, C.I. Pigment Red 83, C.I. Pigment Red 87, C.I. Pigment Red 88, C.I. Pigment Red 89, C.I. Pigment Red 90, C.I. Pigment Red 112, C.I. Pigment Red 114, C.I. Pigment Red 122, C.I. Pigment Red 123, C.I. Pigment Red 149, C.I. Pigment Red 163, and C.I. Pigment Red 177.

Among these, preferred are C.I. Pigment Red 3, C.I. Pigment Red 22, C.I. Pigment Red 38, C.I. Pigment Red 48, C.I. Pigment Red 49, C.I. Pigment Red 53, C.I. Pigment Red 57, C.I. Pigment Red 58, C.I. Pigment Red 60, C.I. Pigment Red 63, C.I. Pigment Red 149, and C.I. Pigment Red 177.

Specific examples of violet pigments which can be used as the light-shielding coloring materials of the present invention include C.I. Pigment Violet 1, C.I. Pigment Violet 2, C.I. Pigment Violet 3, C.I. Pigment Violet 5, and C.I. Pigment Violet 23.

Among these, preferred are C.I. Pigment Violet 1 and C.I. Pigment Violet 23.

Specific examples of blue pigments which can be used as the light-shielding coloring materials of the present invention include C.I. Pigment Blue 1, C.I. Pigment Blue 2, C.I. Pigment Blue 3, C.I. Pigment Blue 15, C.I. Pigment Blue 16, C.I. Pigment Blue 17, C.I. Pigment Blue 22, and C.I. Pigment Blue 25.

Among these, preferred are C.I. Pigment Blue 1, C.I. Pigment Blue 15, and C.I. Pigment Blue 16.

Specific examples of green pigments which can be used as the light-shielding coloring materials of the present invention include C.I. Pigment Green 7, C.I. Pigment Green 8, C.I. Pigment Green 10, C.I. Pigment Green 12, C.I. Pigment Green 36, C.I. Pigment Green 37, and C.I. Pigment Green 38.

Among these, preferred are C.I. Pigment Green 7 and C.I. Pigment Green 36.

Specific examples of brown pigments which can be used as the light-shielding coloring materials of the present invention include C.I. Pigment Brown 1, C.I. Pigment Brown 2, and C.I. Pigment Brown 5.

Specific examples of black pigments which can be used as the light-shielding coloring materials of the present invention include C.I. Pigment Black 1 and C.I. Pigment Black 7.

Among these, preferred is C.I. Pigment Black 7.

These pigments are preferably used in combination of two or more thereof.

The combination of two or more of pigments is preferably (i) a combination of yellow, red, and blue pigments, (ii) a combination of orange and blue pigments, (iii) a combination of yellow and violet pigments, and (iv) a combination of green and red pigments. In the combinations of the pigments, black pigments such as C.I. Pigment Black 1 and C.I. Pigment Black 7 may be used in an amount of 15% by weight or less, based on the total amount of the pigments.

The pigments are generally used in a total amount of from 10 to 150 parts by weight, preferably from 20 to 100 parts by weight, and more preferably from 30 to 60 pares by weight, per 100 parts by weight of the photosensitive resin.

Suitable dyes which can be used as the light-shielding coloring materials of the present invention include oil-soluble dyes, disperse dyes, reactive dyes, acid dyes, basic dyes, and mixtures thereof. In using these dyes, the kind of the photosensitive resin composition can be chosen according to the solvent capable of dissolving the dye.

Specific examples of yellow dyes which can be used as the coloring materials of the present invention include C.I. Direct Yellow 1, C.I. Direct Yellow 8, C.I. Direct Yellow 11, C.I. Direct Yellow 12, C.I. Direct Yellow 26, C.I. Direct Yellow 33, C.I. Direct Yellow 39, C.I. Direct Yellow 44, and C.I. Direct Yellow 50.

Specific examples of red dyes which can be used as the light-shielding coloring materials of the present invention include C.I. Solvent Red 24, C.I. Direct Red 1, C.I. Direct Red 2, C.I. Direct Red 4, C.I. Direct Red 13, C.I. Direct Red 17, C.I. Direct Red 20, C.I. Direct Red 24, C.I. Direct Red 31, C.I. Direct Red 37, C.I. Direct Red 63, C.I. Direct Red 80, and C.I. Direct Red 81.

Specific examples of blue dyes which can be used as the light-shielding coloring materials of the present invention include C.I. Direct Blue 1, C.I. Direct Blue 6, C.I. Direct Blue 15, C.I. Direct Blue 22, C.I. Direct Blue 41, C.I. Direct Blue 71, C.I. Direct Blue 78, C.I. Direct Blue 86, C.I. Direct Blue 98, C.I. Direct Blue 108, C.I. Direct Blue 120, C.I. Direct Blue 158, and C.I. Direct Blue 168.

Specific examples of green dyes which can be used as the light-shielding coloring materials of the present invention include C.I. Direct Green 1, C.I. Direct Green 6, C.I. Direct Green 8, C.I. Direct Green 28, and C.I. Direct Green 59.

Specific examples of violet dyes which can be used as the light-shielding coloring materials of the present invention include C.I. Basic Violet 1, C.I. Direct Violet 1, C.I. Direct Violet 7, C.I. Direct Violet 9, C.I. Direct Violet 12, C.I. Direct Violet 22, C.I. Direct Violet 35, C.I. Direct Violet 47, C.I. Direct Violet 48, and C.I. Direct Violet 51.

These dyes are preferably used in combination of two or more thereof.

The dyes are generally used in a total amount of from 2 to 100 parts by weight, preferably from 2 to 30 parts by weight, per 100 parts by weight of the photosensitive resin.

When the above-mentioned pigments and dyes are used in combination, the pigments are preferably used in an amount of from 30 to 60 parts, and the dyes are preferably used in an amount of from 2 to 10 parts, with each amount based on 100 parts by weight of the photosensitive resin.

The photosensitive resins which can be used in the present invention include:

(1) an acrylic polymer photosensitive resin comprising an acrylic copolymer resin, a polyfunctional acrylic monomer, a methacrylic monomer, a photopolymerization initiator and, if desired, a sensitizer and other additives commonly used in photosensitive resins (as disclosed in U.S. Pat. No. 5,147,759);

(2) a water-soluble photosensitive resin having a photosensitive group, or a water-soluble photosensitive resin comprising a water-soluble resin and a photosensitive agent (as disclosed in U.S. Pat. No. 4,186,069); and (3) an oil-soluble photosensitive resin having a photosensitive group (as disclosed in U.S. Pat. No. 3,023,100).

Preferred is the acrylic polymer photosensitive resin in (1) above as the photosensitive resins.

Specific examples of acrylic copolymer resin in (1) above include a copolymer comprising at least two components selected from acrylic acid, methacrylic acid, methyl acrylate, methyl methacrylate, ethyl acrylate, ethyl methacrylate, 2-hydroxyethyl acrylate, 2-hydroxyethyl methacrylate, 2-hydroxypropyl acrylate, 2-hydroxypropyl methacrylate, n-butyl acrylate, n-butyl methacrylate, isobutyl acrylate, isobutyl methacrylate, benzyl acrylate, benzyl methacrylate, phenoxy acrylate, phenoxy methacrylate, isobornyl acrylate, isobornyl methacrylate. It also is effective to incorporate an acryloyl group or a methacryloyl group into the copolymer resin so as to increase the crosslinking efficiency.

Specific examples of polyfunctional acrylic monomer in (1) above include ethylene glycol diacrylate, ethylene glycol dimethacrylate, triethylene glycol diacrylate, triethylene glycol dimethacrylate, tetraethylene glycol diacrylate, tetraethylene glycol dimethacrylate, propylene glycol diacrylate, propylene glycol dimethacrylate, trimethylolpropane triacrylate, trimethylolpropane trimethacrylate, pentaerythritol triacrylate, pentaerythritol trimethacrylate, pentaerythritol tetraacrylate, pentaerythritol tetramethacrylate, dipentaerythritol pentaacrylate, dipentaerythritol pentamethacrylate, dipentaerythritol hexaacrylate, dipentaerythritol hexamethacrylate, and carboepoxy diacrylate.

Addition of an organic acid to the acrylic monomer is effective in the case of alkali development. Addition of an epoxy group is also useful for affording heat resistance.

Photopolymerization initiators in (1) above include photo-decomposition type and hydrogen transfer type. Specific examples of suitable initiators include benzophenone, 3,3-dimethyl- 4-methoxybenzophenone, Michler's ketone, 2,2-dimethoxy- 2-phenylacetophenone, 2,4,6-(trihalomethyl)-triazine, 2-(o-chlorophenyl)-4,5-diphenylimidazolyl dimer, diethylthioxanthone, dimethylthioxanthone, isopropylthioxanthone, 2-chlorothioxanthone, 9-phenylacridine, 1,7-bis(9-acridinyl)heptane, 1,5-bis(9-acridinyl)pentane, 1,3-bis(9-acridinyl)propane, and trimethylbenzoyldiphenylphosphine oxide.

For the purpose of sensitizing the above-mentioned photopolymerization initiator, various amine compounds may be used. Specific examples of amine compounds include triethanolamine, isoamyl p-dimethylaminobenzoate, ethyl p-dimethylaminobenzoate, and other various aromatic amine compounds. For the purpose of maintaining developability, various organic acids may be added. Carboxybenzotriazole and anhydrides such as maleic anhydride, are also useful.

The water-soluble photosensitive resin having a photosensitive group or water-soluble photosensitive resin composition comprising a water-soluble resin and a photosensitive agent in (2) above includes a polyvinyl alcohol/stilbazolium system and a combination of a water-soluble resin and a photo-crosslinking agent. Specific examples of the water-soluble resin include polyvinyl alcohol, polyacrylamide, polyacrylamide-diacetone acrylamide copolymer, gelatin, casein, and glue. Specific examples of the photo-crosslinking agent are bichromates, diazo compounds, and mono- or bisazide compounds.

The oil-soluble photosensitive resin having a photosensitive group in (3) above includes photo-crosslinking resins such as cinnamic acid type and bisazide type, and photo-decomposing resins such as an o-quinonediazide type.

If a light-shielding film is permitted to have transmission of up to 2% in the visible light region (from 425 to 650 nm), Applicants have-discovered that it is possible to increase the transmission in part of the UV region (from 330 nm to less than 425 nm) to 1% or more. Accordingly, by controlling the transmission in both of the above wavelength regions respectively, the requirement for light shielding properties in the visible region and the requirement for transmission in the UV region can be simultaneously satisfied.

The present invention will now be illustrated in greater detail with reference to several Examples, but it should be understood that the present invention is not to be construed as being limited thereto. All the percents, parts, and ratios are by weight unless otherwise indicated.

In the following Examples and Comparative Examples, sensitivity and transmission were measured according to the following methods.

1) Sensitivity

The amount of exposure (mJ/cm$^2$) which causes 90% or more of a photosensitive resin film to remain after development was measured. The smaller the exposure amount, the higher the sensitivity.

2) Light Transmission

A photosensitive resin composition was coated on a transparent glass substratum and dried to form a film having a thickness of 2.0 μm. A polyvinyl alcohol layer was formed thereon to a thickness of 1.0 μm. A transmission of the resulting sample in each of a light wavelength region from 330 nm to less than 425 nm and a light wavelength region from 425 nm to 650 nm was measured with a transmission measuring apparatus "U-2000" manufactured by Hitachi, Ltd. using, as a reference, a transparent glass substratum having thereon the same polyvinyl alcohol layer.

EXAMPLE 1

| | |
|---|---|
| Methacrylic acid/methyl methacrylate (25/75 by wt %) copolymer | 6 parts |
| Pentaerythritol tetraacrylate | 4 parts |
| Diethylthioxanthone | 1.2 parts |
| Michler's ketone | 1.2 parts |
| 2-(o-Chlorophenyl)-4,5-diphenyl-imidazolyl dimer | 0.2 parts |
| Ethylene glycol monoethyl ether acetate | 20 parts |
| Coloring material: | |
| C.I. Pigment Black 7 | 4 parts |
| C.I. Pigment Blue 15 | 11 parts |
| C.I. Pigment Red 177 | 3.5 parts |
| C.I. Pigment Yellow 139 | 1.5 parts |

A mixture of the above components was kneaded in a sand mill and filtered through a membrane filter (pore size: 5 μm) to prepare a photosensitive resin composition.

The composition was coated on a cleaned glass substratum by spin coating to a thickness of 2.0 μm and dried on a hot plate at 80° C. for 3 minutes. A 10% aqueous solution of polyvinyl alcohol was coated thereon by spin coating to a thickness of 1.0 μm and dried at 80° C. for 1 minute. The coated substratum was exposed to light and developed with a 0.5% aqueous solution of sodium carbonate at 25° C. for 60 seconds.

The photosensitive resin composition, as above obtained, had satisfactory sensitivity of 50 mJ/cm$^2$. The transmission curve is shown in FIG. 2. As can be seen from FIG. 2, the transmission rose to 1% or more at around 400 nm and that in a wavelength region from 425 nm to 650 nm, the transmission was controlled to 2% or less.

EXAMPLE 2

A light-shielding film was prepared in the same manner as in Example 1, except for using the following components.

| | |
|---|---|
| Methacrylic acid/methyl methacrylate (25/75 by wt %) copolymer | 6 parts |
| Trimethylolpropane triacrylate | 4 parts |
| Diethylthioxanthone | 2 parts |
| Ethyl p-dimethylaminobenzoate | 1 part |
| 2-(o-Chlorophenyl)-4,5-diphenyl-imidazolyl dimer | 0.3 parts |
| Ethylene glycol monoethyl ether acetate | 35 parts |
| Coloring material: | |
| C.I. Solvent Red 24 ("Oil Red RR" produced by Orient Chemical K.K.) | 2 parts |
| "Kayaset Black KR" produced by Nippon Kayaku Co., Ltd. | 2 parts |
| Bis(1,4-isopropylamino)anthraquinone ("PTB 45" produced by Mitsubishi Kasei Corp.) | 2 parts |
| C.I. Basic Violet 1 ("Methyl Violet Pure Special" produced by Orient Chemical K.K.) | 2 parts |

Figure 3:
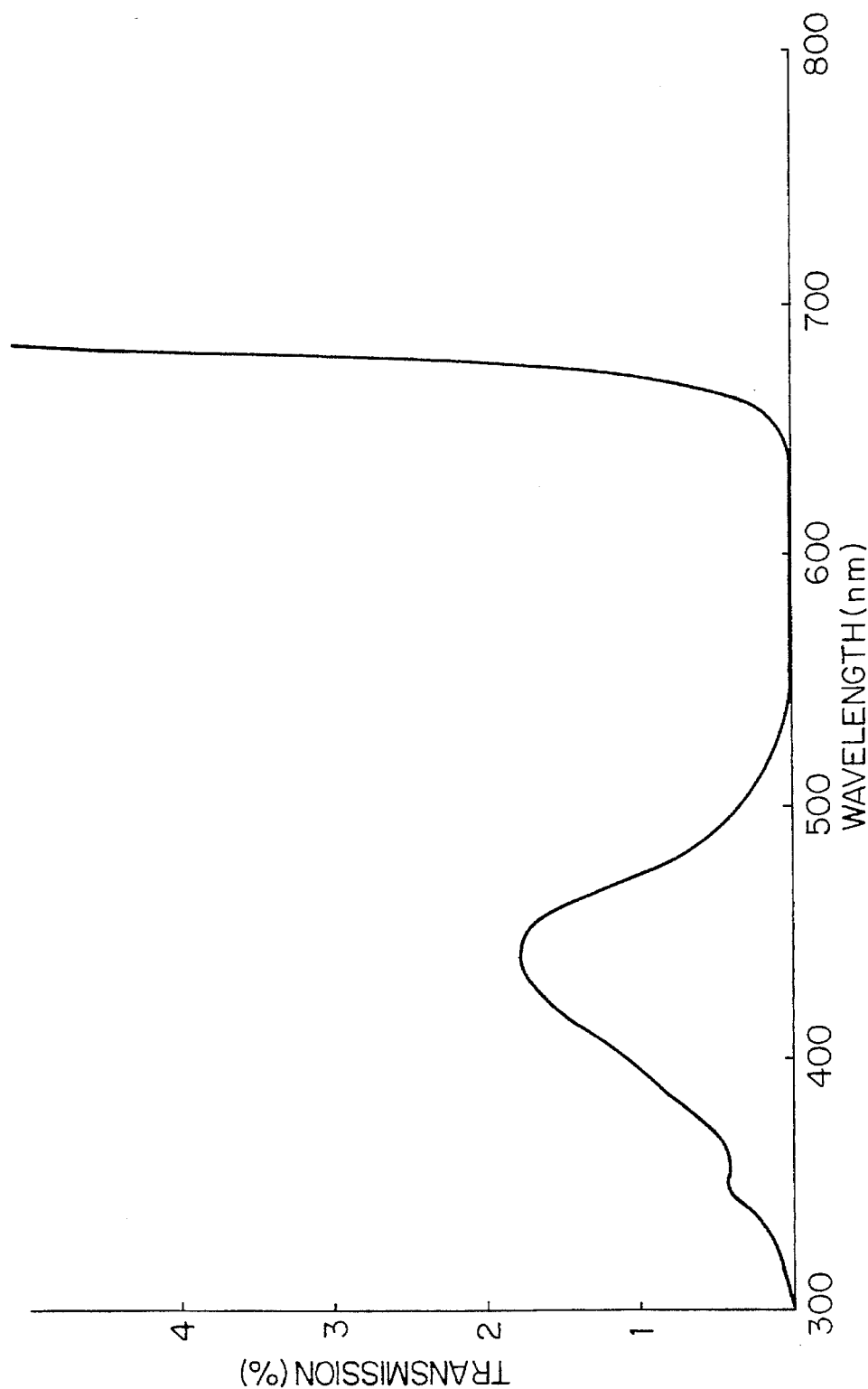

The resulting photosensitive resin composition had satisfactory sensitivity of 100 mJ/cm$^2$. The transmission curve is shown in FIG. 3, in which the transmission rose to 1% or more at around 400 nm and light transmission was controlled to 2% or less in a wavelength region from 425 nm to 650 nm.

COMPARATIVE EXAMPLE 1

Figure 4:
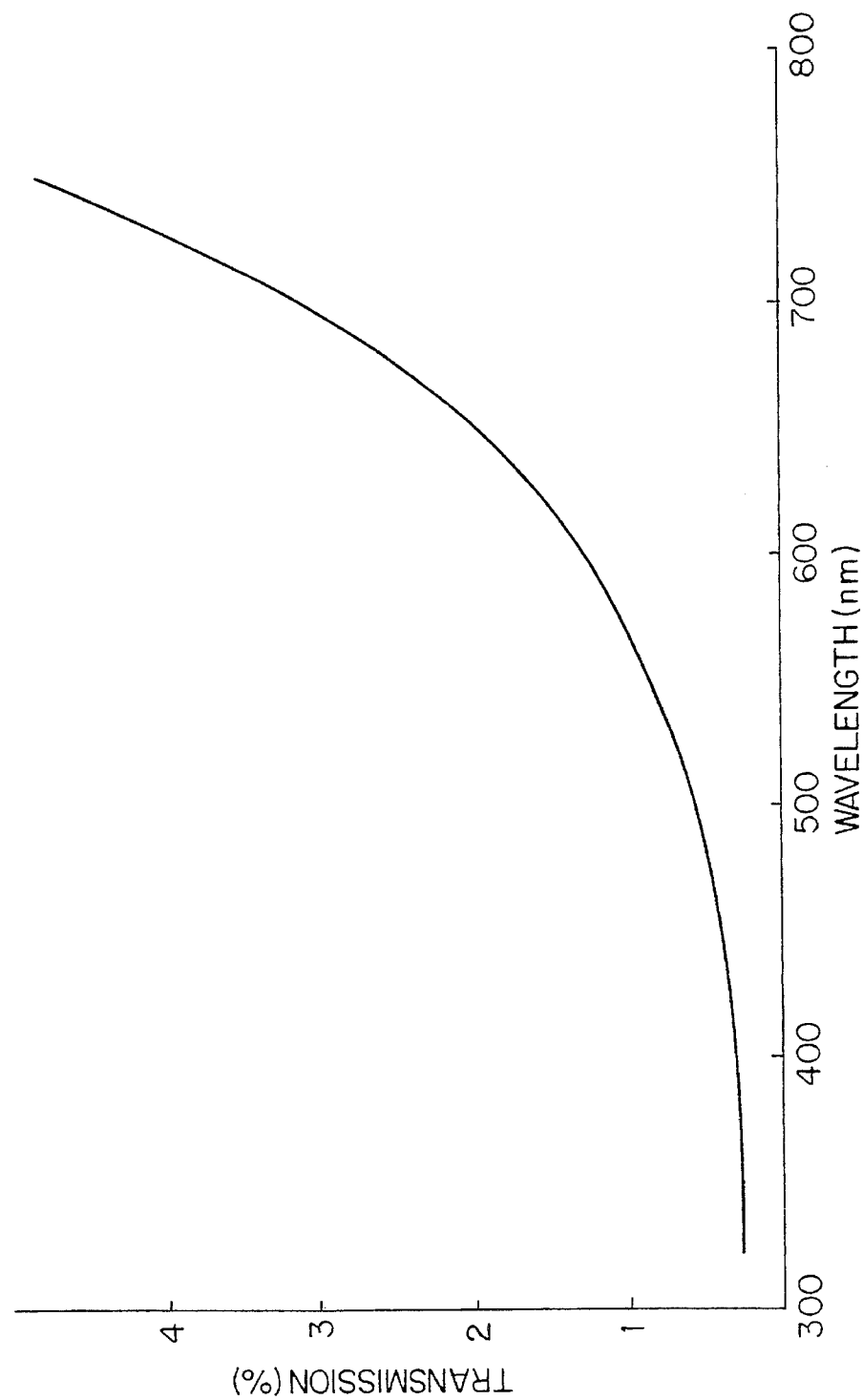
FIGS. 4 and 5 each are a transmission curve of the light-shielding film prepared in Comparative Examples 1 and 2, respectively.

A light-shielding film was prepared in the same manner as in Example 1, except for replacing the total coloring materials with 22 parts of C.I. Pigment Black 7 ("Denka Black" produced by Denki Kagaku Kogyo K.K.) The resulting photosensitive resin composition had sensitivity as low as 400 mJ/cm$^2$. The transmission curve is shown in FIG. 4. It is seen that the transmission in a wavelength region from 425 nm to 650 nm was not more than 2% but the transmission curve contained no region having a transmission of 1% or more in a region from 330 nm to less than 425 nm.

COMPARATIVE EXAMPLE 2

Figure 5:
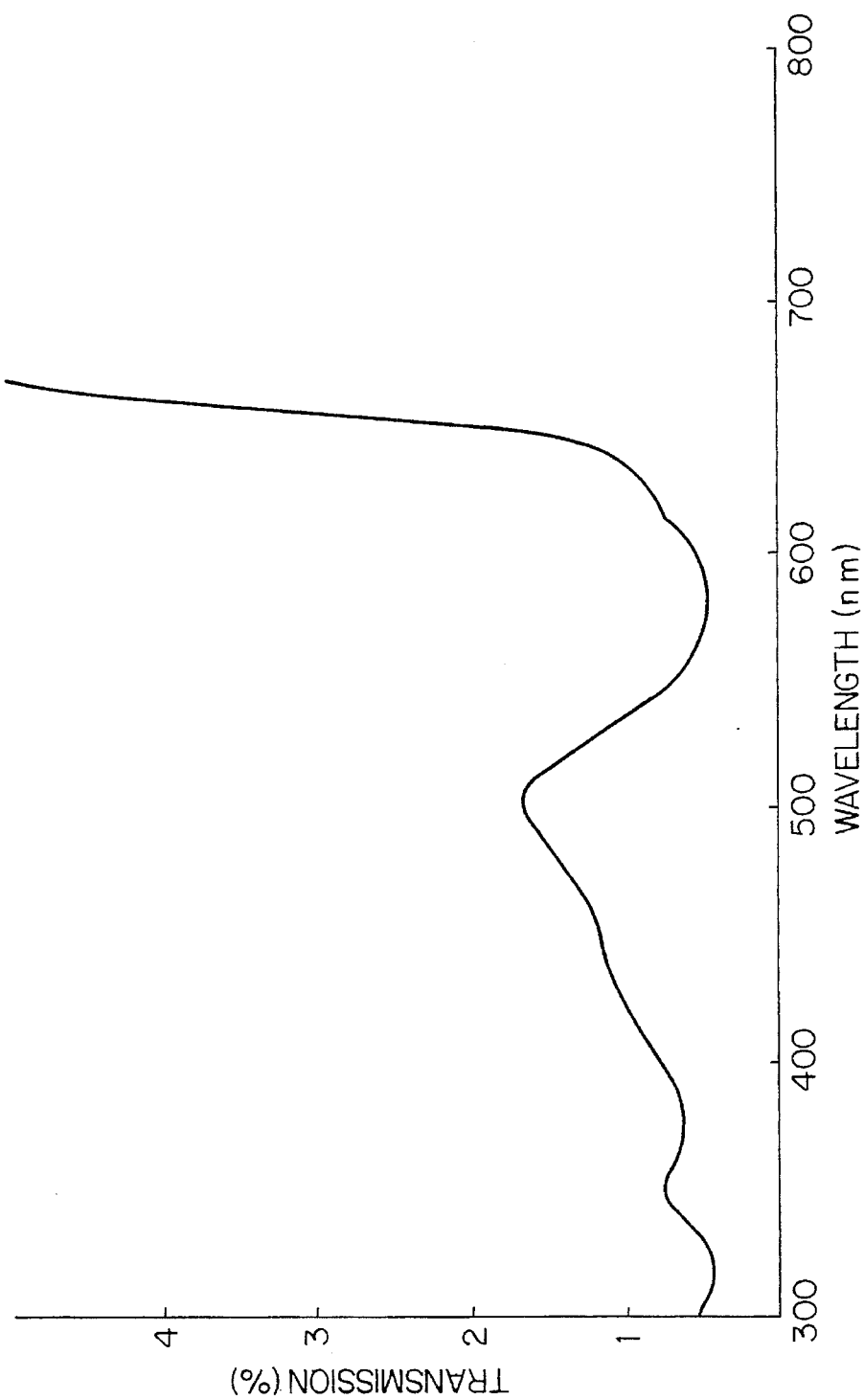

A light-shielding film was prepared in the same manner as in Example 1, except for replacing the total coloring materials with 8 parts of "Kayaset Black KR" (produced by Nippon Kayaku Co., Ltd.). The resulting photosensitive resin composition had sensitivity as low as 500 mJ/cm$^2$. The transmission curve shown in FIG. 5 indicates similar results to Comparative Example 1.

As described above, a light-shielding film obtained from the photosensitive resin composition of the present invention has its transmission in the visible region controlled to 2% or less and therefore exhibits sufficient light shielding properties while exhibiting a transmission of 1% or more in part of the UV region assuring satisfactory sensitivity. Therefore, the photosensitive resin composition of the present invention can be used for formation of a light-shielding film as a black matrix or black stripe of liquid crystal displays, view finders of video cameras, plasma displays, fluorescence displays, and the like, or for prevention of operating errors due to light in TFT or semiconductor elements formed or mounted on a glass substratum.

While the invention has been described in detail and with reference to specific examples thereof, it will be apparent to one skilled in the art that various changes and modifications can be made therein without departing from the spirit and scope thereof.

What is claimed is:

1. A process for preparing a light-shielding film, wherein the process comprises:

(a) coating a photosensitive resin composition on a substrate, said photosensitive resin comprising a photosensitive resin and a light-shielding coloring material in admixture, wherein the light-shielding coloring material comprises pigments selected from the group consisting of (i) yellow, red, and blue pigments, (ii) orange and blue pigments, (iii) yellow and violet pigments, and (iv) green and red pigments;

(b) drying the photosensitive resin composition;

(c) exposing the photosensitive resin composition to light; and (d) developing the photosensitive resin composition, wherein light transmission properties after formation of the light-shielding film are controlled by the light-shielding coloring material so that (i) the light transmission through the light-shielding film is 1% or more in at least one wavelength of a light wavelength region of from 330 nm to less than 425 nm, and (ii) the light transmission through the light-shielding film is 2% or less in a light wavelength region of from 425 nm to 650 nm.

2. The process for preparing a light-shielding film as in claim 1, wherein the light-shielding coloring material comprises pigments having a mean particle size of from 0.05 to 2.0 μm.

3. The process for preparing a light-shielding film as in claim 1, wherein the light-shielding coloring material comprises pigments used in a total amount of from 10 to 150 parts by weight per 100 parts by weight of the photosensitive resin.

4. The process for preparing a light-shielding film as in claim 1, wherein the light-shielding coloring material comprises dyes used in a total amount of from 2 to 100 parts by weight per 100 parts by weight of the photosensitive resin.

5. The process for preparing a light-shielding film as in claim 1, wherein the photosensitive resin comprises an acrylic polymer photosensitive resin comprising an acrylic copolymer resin, a polyfunctional acrylic monomer, a methacrylic monomer, and a photopolymerization initiator.

6. The process for preparing a light-shielding film as in claim 1, wherein the photosensitive resin comprises (i) a water-soluble photosensitive resin having a photosensitive group or (ii) a water-soluble photosensitive resin comprising a water-soluble resin and a photosensitive agent.

7. The process for preparing a light-shielding film as in claim 1, wherein the photosensitive resin comprises an oil-soluble photosensitive resin having a photosensitive group.

8. The process for preparing a light-shielding film as in claim 1, wherein the yellow pigment is selected from the group consisting of C.I. Pigment Yellow 1, C.I. Pigment Yellow 3, C.I. Pigment Yellow 12, C.I. Pigment 13, C.I. Pigment Yellow 14, C.I. Pigment Yellow 14, C.I. Pigment 83, and C.I. Pigment Yellow 139;

the orange pigment is C.I. Pigment Orange 13;

the red pigment is selected from the group consisting of C.I. Pigment Red 3, C.I. Pigment Red 22, C.I. Pigment Red 38, C.I. Pigment Red 48, C.I. Pigment Red 49, C.I. Pigment Red 53, C.I. Pigment Red 57, C.I. Pigment Red 58, C.I. Pigment Red 60, C.I. Pigment Red 63, C.I. Pigment Red 149, and C.I. Pigment Red 177;

the violet pigment is selected from the group consisting of C.I. Pigment Violet 1 and C.I. Pigment Violet 23;

the blue pigment is selected from the group consisting of C.I. Pigment Blue 1, C.I. Pigment blue 15, and C.I. Pigment Blue 16; and the green pigment is selected from the group consisting of C.I. Pigment Green 7 and C.I. Pigment Green 36.

9. The process for preparing a light-shielding film as in claim 1, further comprising the step of forming a polyvinyl alcohol layer on said photosensitive resin composition.

10. The process for preparing a light-shielding film as in claim 1, further comprising the step of heat treating the photosensitive resin composition subsequent to development for complete curing.

* * * * *